(12) United States Patent
Asano et al.

(10) Patent No.: US 10,241,424 B2
(45) Date of Patent: Mar. 26, 2019

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Tosiya Asano, Utsunomiya (JP); Keiji Emoto, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 237 days.

(21) Appl. No.: 14/917,464

(22) PCT Filed: Oct. 16, 2014

(86) PCT No.: PCT/JP2014/078156
§ 371 (c)(1),
(2) Date: Mar. 8, 2016

(87) PCT Pub. No.: WO2015/068578
PCT Pub. Date: May 14, 2015

(65) Prior Publication Data
US 2016/0223918 A1    Aug. 4, 2016

(30) Foreign Application Priority Data

Nov. 5, 2013   (JP) ................................ 2013-229781
Sep. 24, 2014  (JP) ................................ 2014-194299

(51) Int. Cl.
*G03F 9/00* (2006.01)
*G03F 7/00* (2006.01)

(52) U.S. Cl.
CPC ............ *G03F 9/703* (2013.01); *G03F 7/0002* (2013.01); *G03F 9/7042* (2013.01)

(58) Field of Classification Search
CPC ....... G03F 9/703; G03F 9/7042; G03F 7/0002
See application file for complete search history.

(56) References Cited

U.S. PATENT DOCUMENTS 7,630,067 B2   12/2009   Nimmakayala et al.
8,845,317 B2    9/2014   Suehira et al.
(Continued)

FOREIGN PATENT DOCUMENTS

JP   2008522412 A   6/2008
JP   2011181944 A   9/2011
(Continued)

OTHER PUBLICATIONS

International Search Report issued in PCT/JP2014/078156, dated Feb. 3, 2015.
(Continued)

*Primary Examiner* — Robert J Grun
(74) *Attorney, Agent, or Firm* — Rossi, Kimms & McDowell LLP (57) ABSTRACT

An imprint apparatus includes: a stage configured to hold the substrate; a detector configured to detect a relative position between a shot region and the mold in a direction parallel to a surface of the substrate; and a controller configured to obtain, in an imprint process on a shot region different from a target shot region, information relating to a relative position, between the other shot region and the mold, used for aligning the other shot region after bringing the mold and the imprint material into contact with each other, and, when performing the imprint process on the target shot region, adjust a relative position between the target shot region and the mold in the direction by using a detection result on the target shot region and the obtained information.

15 Claims, 4 Drawing Sheets

(56) References Cited

U.S. PATENT DOCUMENTS

| | | |
|---|---|---|
| 2007/0242272 A1 | 10/2007 | Suehira et al. |
| 2011/0024930 A1 | 2/2011 | Sato |
| 2013/0015599 A1 | 1/2013 | Kawahara |
| 2014/0346700 A1 | 11/2014 | Sato et al. |

FOREIGN PATENT DOCUMENTS

| | | |
|---|---|---|
| JP | 2013157553 A | 8/2013 |
| JP | 2014229883 A | 12/2014 |
| KR | 1020090009874 A | 1/2009 |
| KR | 1020130008464 A | 1/2013 |

OTHER PUBLICATIONS

Written Opinion issued in PCT/JP2014/078156, dated Feb. 3, 2015.
Office Action issued in Korean Appln. No. 10-2016-7014125 dated Oct. 20, 2017.
Office Action issued in Japanese Appln. No. 2014-194299 dated Jun. 25, 2018. English translation provided.

IMPRINT APPARATUS, IMPRINT METHOD, AND ARTICLE MANUFACTURING METHOD

TECHNICAL FIELD

The present invention relates to an imprint apparatus, an imprint method, and an article manufacturing method.

BACKGROUND ART

An imprint technique is a technique of forming a micropattern on a substrate (wafer) by using a mold on which the micropattern is formed. An example of the imprint technique is a photo-curing method. In the imprint technique using this photo-curing method, a fluidable resin as an imprint material is supplied to the position of a shot region which is an imprint region on a wafer. The supplied resin is cured by irradiation with light in a state in which a pattern of a mold is pressed against (imprinted on) the resin. The pattern of the cured resin is transferred onto the substrate by separating (releasing) the mold from the resin.

In the manufacture of a semiconductor chip, it is necessary to accurately align the wafer and the mold when imprinting the mold. As a method of aligning the wafer and the mold in an imprint apparatus, a so-called die-by-die method is known in which alignment is performed by detecting a mark formed on the mold and a mark formed in each shot region of the wafer.

Japanese Patent Laid-Open No. 2008-522412 describes an imprint apparatus which calculates a relative displacement between a mold (template) and a wafer by detecting an alignment mark, and relatively moves a stage (a template stage or a substrate stage).

In imprint of a micropattern, a gap between a mold and a wafer at the time of imprinting is 1 μm or less. A resin which fills this gap has viscoelasticity which combines viscosity and elasticity. If both of the mold and the wafer are relatively moved for alignment at the time of imprinting, the viscoelasticity of the resin causes a force to act between them. Since this force also has effect on a mold pattern, the micropattern may deform. The pattern deformation unwantedly produces a defective semiconductor chip.

SUMMARY OF INVENTION

Accordingly, the present invention provides an imprint apparatus advantageous in reducing the deformation of a mold pattern.

The present invention in its one aspect provides an imprint apparatus for performing an imprint process for forming a pattern of an imprint material for each shot region by bringing the imprint material on a substrate and a mold into contact with each other, the apparatus comprising: a stage configured to hold the substrate; a detector configured to detect a relative position between the shot region and the mold in a direction parallel to a surface of the substrate; and a controller configured to control the imprint process, wherein the controller is configured to obtain, in an imprint process performed in another shot region different from a target shot region, information relating to a relative position between the other shot region and the mold or a moving amount of the other shot region relative to the mold, which was used for aligning the other shot region and the mold with each other in the direction after bringing the mold and the imprint material into contact with each other, and, when performing the imprint process on the target shot region, adjust a relative position between the target shot region and the mold in the direction by using a detection result on the target shot region by the detector and the obtained information, and bring the mold and the imprint material into contact with each other to perform the imprint process on the target shot region.

Further features of the present invention will become apparent from the following description of exemplary embodiments with reference to the attached drawings.

DESCRIPTION OF EMBODIMENTS

Figure 1:
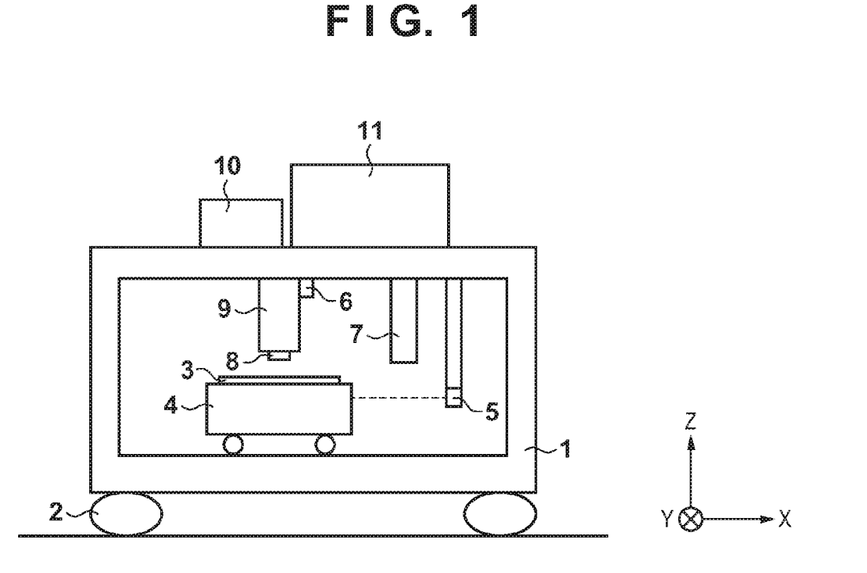
FIG. 1 is a view for explaining an imprint apparatus.

The embodiment of the present invention will be described below. FIG. 1 is a view showing an imprint apparatus applicable to the present invention. First, the arrangement of the imprint apparatus will be described. A main body 1 of the imprint apparatus is installed on a floor through an anti-vibration unit 2 with three or four legs each using an air spring or the like. A wafer (substrate) 3 is mounted, by a wafer chuck (not shown), on a wafer stage (stage) 4 which is movable in the first direction (X direction and Y direction) parallel to the surface of the wafer 3. In this embodiment, a direction vertical to a direction (Z direction) in which the wafer 3 and a mold 8 are brought close to each other refers to the first direction (X direction and Y direction). The wafer stage 4 has a stroke in the X direction and the Y direction enough to be able to perform an imprint process on the entire surface of the wafer 3 and move the wafer 3 to a position where loading/unloading is performed by a wafer exchange hand (not shown).

Although the wafer stage 4 is illustrated simply as a stage having one box and wheels in FIG. 1, it actually has a structure as will be described below. As the wafer stage 4, a stage which mounts a fine moving stage having a short stroke and a high positioning accuracy on a coarse moving stage having a long stroke in the X direction and the Y direction is used. The arrangement of the wafer stage 4 is not limited to this, and can use a stage which is generally used in a semiconductor exposure apparatus and able to position the wafer at a high accuracy. The X-axis position of the wafer stage 4 is measured by a laser interferometer 5 provided in the main body 1 and a reflecting mirror (not shown) which is provided on the wafer stage 4 and reflects a laser beam. Similarly, a laser interferometer which measures the position of the wafer stage 4 in the Y direction is also provided. A scale substrate provided on the main body 1 and an encoder system constituted by an optical devices provided on the wafer stage 4 may be used to measure the position of the wafer stage 4.

A photo-curing type resin (imprint material) used for an imprint process is supplied to each shot region on the wafer 3 by a supply unit 7 provided in the main body 1. The mold 8 on which a micropattern is formed is supported in the main body 1 by an imprint head mechanism 9. Each shot region is a region to which the pattern formed on the mold is transferred. The imprint head mechanism 9 can move in a Z-axis direction while holding the mold 8.

A sensor (second detector) 6 configured to detect the displacement of the mold 8 in a positioning direction is provided in the vicinity of the imprint head mechanism 9. A value detected by the sensor 6 is input to a mold displacement calculator 14 (to be described later). Details of the sensor 6 and the mold displacement calculator 14 will be described later. A relative position between the mold 8 and the wafer 3 in the X direction and the Y direction is measured by an alignment detector (detector) 10 provided in the main body 1. An alignment mark is formed in each shot region on the wafer 3 by the previous imprint process. An alignment mark corresponding to this is also formed on the mold 8. The alignment detector 10 irradiates the mold 8 and the wafer 3 with alignment light to detect their alignment marks by an alignment scope. The alignment detector 10 calculates the relative position between the mold 8 and the wafer 3 by performing an image process on the detection result by the alignment scope. An illumination system 11 which emits ultraviolet rays to cure the resin is mounted on the main body 1.

Figure 2:
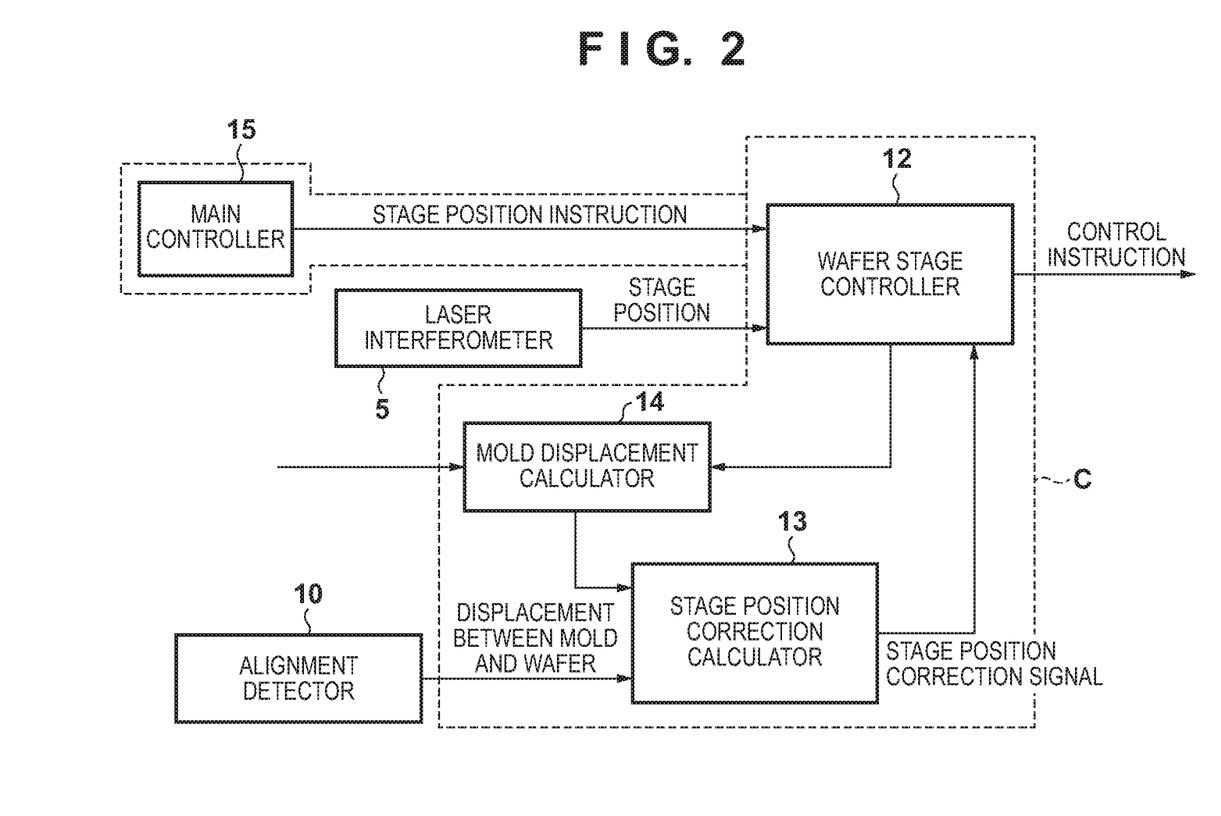
FIG. 2 is a block diagram showing the control system of the imprint apparatus.

FIG. 2 is a block diagram showing the control system of the imprint apparatus. The function of the control system will be described together with each operation in an imprint process. The position control of the wafer stage 4 is performed by a wafer stage controller 12. The wafer stage controller 12 uses a feedback control system (not shown) which feedbacks a deviation obtained by subtracting the stage position measured by the above-described laser interferometer 5 from a stage position instruction sent from a main controller 15 of the imprint apparatus.

First, the wafer stage 4 moves to a wafer exchange position, and the wafer 3 is mounted on a wafer chuck (not shown) by a wafer exchange hand (not shown). At this time, owing to the positioning accuracy of the wafer exchange hand, the wafer 3 is mounted with a displacement relative to the wafer chunk in the X and Y directions, and a θz-axis direction which is a rotation direction about a Z-axis when mounting the wafer 3. This displacement is obtained by detecting a relative position between a reference mark (not shown) provided on the wafer stage 4 and a mark provided on the wafer 3 by the alignment detector 10. This displacement information is sent to the wafer stage controller 12 via a stage position correction calculator 13. The wafer stage controller 12 corrects the displacement of the wafer 3 relative to the wafer chunk by correcting the stage position as needed. However, the position (displacement) of the wafer 3 relative to the mold 8 can be corrected by correcting a position of the imprint head mechanism 9 instead of correcting the stage position. Further, the position (displacement) of the wafer 3 relative to the mold 8 can be corrected by correcting a position of the imprint head mechanism 9 in addition to correcting the stage position.

The wafer stage controller 12 moves the wafer stage 4 so that the first shot region on the wafer 3 which performs imprint is located under the supply unit 7. The supply unit 7 supplies the resin to the first shot region. After the wafer stage controller 12 moves the wafer stage 4 so that the first shot region is located immediately under the mold 8, the imprint head mechanism 9 lowers the mold 8 to perform imprint. This imprint is an operation of filling a gap between the mold 8 and the wafer 3 with the resin on the wafer 3 by pressing the mold 8 against the resin with the imprint head mechanism, while this gap is set to 1 μm or less.

A displacement occurs in the relative position between the mold 8 and the wafer 3 immediately after imprint. This displacement is detected by the alignment detector 10 after the completion of the filling of the gap between the mold 8 and the wafer 3 with the resin. In particular, after bringing the mold 8 and the resin supplied on the first shot region into contact with each other, the displacement in a direction parallel to a surface of the wafer 3 is detected by the alignment detector 10 by detecting an alignment mark formed on the mold 8 and an alignment mark formed in the first shot region. The displacement detected by the alignment detector 10 is sent to the stage position correction calculator 13. A stage correction signal output by the stage position correction calculator 13 is sent to the wafer stage controller 12. The function of the stage position correction calculator 13 will be described in detail later. The correction movement of the wafer stage 4 is performed by the wafer stage controller 12, and the wafer 3 is positioned relative to the mold 8. The displacement detected in this manner is obtained by the imprint apparatus as information, which is used for aligning a shot region and the mold 8 with each other in a direction parallel to the surface of the wafer 8, relating to a relative position between the shot region and the mold 8. If the displacement of the wafer 3 relative to the mold 8 at the time of initial imprinting when the mold 8 contacts the resin is large, a large error is included in the relative position between the wafer 3 and the mold 8 detected by the alignment detector 10. In this case, the alignment detector 10 repeatedly detects displacements, keeps on sending displacement information to the stage position correction calculator 13, and performs correction driving of the wafer stage 4, thus gradually reducing the displacements. At the point in time when each displacement detected by the alignment detector 10 becomes equal to or less than a predetermined value, the main controller 15 determines that the positioning of the wafer 3 is completed. The illumination system 11 irradiates the resin through the mold 8 with ultraviolet rays, thereby curing the resin. After curing the resin, the imprint head mechanism 9 is raised to separate the mold 8 from the resin, thereby completing imprint on the first shot region.

Figure 3:
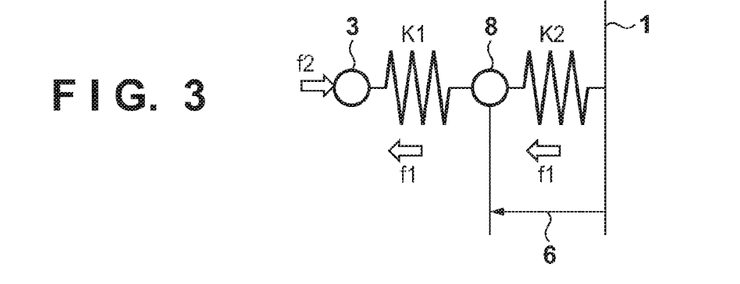
FIG. 3 is a conceptual view for explaining the characteristic of a force acting on a mold and a wafer.

Next, the function of the mold displacement calculator 14 will be described. FIG. 3 is a conceptual view of a force acting between the main body 1, the mold 8, and the wafer 3. In FIG. 3, the viscoelasticity of the resin is indicated by a spring K1. A spring K2 is a spring between the mold 8 and the main body 1, and mainly has the rigidity of a support system of the imprint head mechanism 9 for the main body 1. If the wafer stage 4 is moved at the time of imprinting, a force f1 is generated between the mold 8 and the wafer 3 owing to the viscoelasticity of the resin which fills the gap between the wafer 3 and the wafer 3.

The deviation of the wafer stage 4 caused by this force f1 is eliminated by the action of the wafer stage controller 12. That is, a control instruction from the wafer stage controller 12 is sent to an actuator (not shown), and generates a control force f2 to the wafer stage 4. The force f2 and the force f1 are balanced. Since the spring K1 having the viscoelasticity of the resin and the spring K2 between the mold 8 and the main body 1 (at a reference position) act in series, the force f1 also acts on the spring K2. Therefore, the spring K2 is elongated by the control force f2, thereby displacing the mold 8. The elongation amount of the spring K2 corresponding to the displacement of the mold 8 is measured by the sensor 6 provided in the imprint head mechanism 9. A displacement sensor which measures the relative position between the mold 8 and the main body 1 is used as the sensor 6, a sensor main body is installed in the main body 1, and measures a displacement up to a sensor target provided in the imprint head mechanism. A noncontact high-precision device such as the laser interferometer can be used as the displacement sensor.

If a strain gauge is used as the sensor 6, the strain gauge is pasted on a supporting portion for the main body 1 of the imprint head mechanism 9, and the displacement of the imprint head mechanism 9 is obtained from a strain amount. As described above, the force f2 and the force f1 are balanced. Therefore, it is possible to achieve a sensorless arrangement by calculating the force f2 based on the control instruction from the wafer stage controller 12, and calculating the displacement of the imprint head mechanism 9 based on a spring constant obtained in advance between the main body 1 and the imprint head mechanism 9. The spring constant between the main body 1 and the imprint head mechanism 9 is a coefficient which defines a driving force when the wafer stage 4 is moved in the positioning direction and the displacement amount of the mold 8 in the positioning direction.

An error may occur in the thus obtained displacement of the mold 8. For example, if the displacement sensor is used, a displacement between the mold 8 itself facing the wafer 3 and the sensor target needs to be further added to a displacement sensor value. Since linear calculation can nearly approximate this error, correction can be performed by multiplying the displacement sensor value by a correction gain. As for another method, correction may be performed similarly. Mold displacement information obtained by the mold displacement calculator 14 is sent to the stage position correction calculator 13. The main controller 15, the wafer stage controller 12, the mold displacement calculator 14, and the stage position correction calculator 13 form a controller C.

The stage position correction calculator 13 will now be described in detail. As described above, if the displacement between the mold 8 and the wafer 3 is large, a displacement value measured by the alignment detector 10 includes the large error. Therefore, it is impossible to accurately obtain an initial displacement amount between the mold 8 and the wafer 3 at the time of imprinting. It is possible, however, to estimate the initial displacement amount between the mold 8 and the wafer 3 at the time of imprinting by subtracting a mold displacement amount sent from the mold displacement calculator 14 from the moving amount of the wafer stage 4 at the time of completion of the alignment between the mold 8 and the wafer 3. The estimated value of this initial displacement is stored in a storage unit in the stage position correction calculator 13. The second shot region finishes supplying the resin as in the first shot region, and is positioned under the imprint head mechanism 9. The stage position correction calculator 13 generates a correction instruction and sends it to the wafer stage controller 12 based on the estimated value, stored in the storage unit, of the initial displacement when imprinting the first shot region. A concrete example of a method of generating the correction instruction will be described later.

The wafer stage controller 12 adds the correction instruction to the stage position instruction sent from the main controller 15, thereby performing the position control of the wafer stage 4. The movement of the wafer stage 4 by this correction instruction ends before the completion of the filling of the gap between the mold 8 and the wafer 3 with the resin by lowering the imprint head mechanism 9. That is, the wafer stage 4 is moved with almost no influence of the viscoelasticity of the resin. After the completion of moving the wafer stage 4 by the correction instruction and then filling with the resin, alignment between the mold 8 and the second shot region is performed by the alignment detector 10 as in the first shot region.

After the completion of the alignment, the resin is cured by irradiation with ultraviolet rays by the illumination system 11, and then the imprint head mechanism 9 is raised, thereby completing imprint on the second shot region. At this time, as in the first shot region, the displacement of the mold 8 is calculated by the mold displacement calculator 14, and sent to the stage position correction calculator 13. The stage position correction calculator 13 calculates the estimated value of the initial displacement of the second shot region, and stores it in the storage unit. Subsequently, similar operations are performed on all shot regions within one wafer, thereby completing an imprint process on one wafer. The wafer stage 4 moves to the wafer exchange position, removes the wafer 3 from the wafer chuck (not shown) by the wafer exchange hand (not shown), and mounts a new wafer 3 on which an imprint process will be performed next.

Figure 4A:
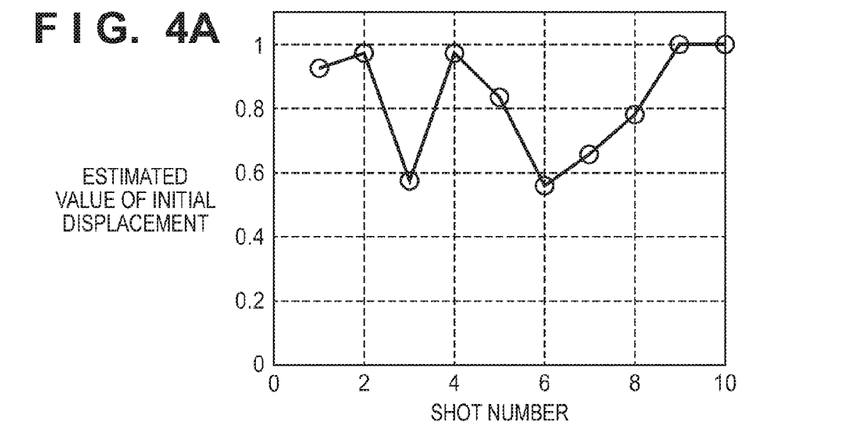
FIG. 4A is a graph of the estimated value of an initial displacement amount.

The concrete example of the method of generating the correction instruction in the stage position correction calculator 13 will now be described. FIG. 4A is an example of the estimated value of an initial displacement (offset) in an X-axis direction from the first shot region to the tenth shot region of a certain wafer. The estimated value is normalized and shown, assuming that a maximum value is 1. The offset is the driving amount of the wafer stage 4 to the mold 8 which has been taken to position a target shot region relative to the mold 8 after bringing the mold 8 into contact with the resin. The offset is information concerning the driving amount of the wafer stage 4 relative to the mold 8. Thus, the driving amount can be obtained as information concerning moving of a shot region relative to the mold which was used for aligning the first region and the mold 8 with each other in a direction parallel to the surface of the wafer 3 after bringing the mold 8 and the resin supplied on the first shot region into contact with each other. In this example, the estimated value of the initial displacement includes two components, namely, a variation component of a range about 0.4 and a shift component of range about 0.8. The variation component is caused by the error in the estimated value itself of the initial displacement or a displacement which has occurred in an imprint process on an underlayer before that on the wafer 3. The shift component includes a wafer alignment error. Further, the estimated value of an initial displacement can be a displacement, between an alignment mark formed on the mold 8 and an alignment mark formed in the first shot region, which was detected by the alignment detector 10 after bringing the mold 8 and the resin supplied on the first shot region into contact with each other.

Figure 4B:
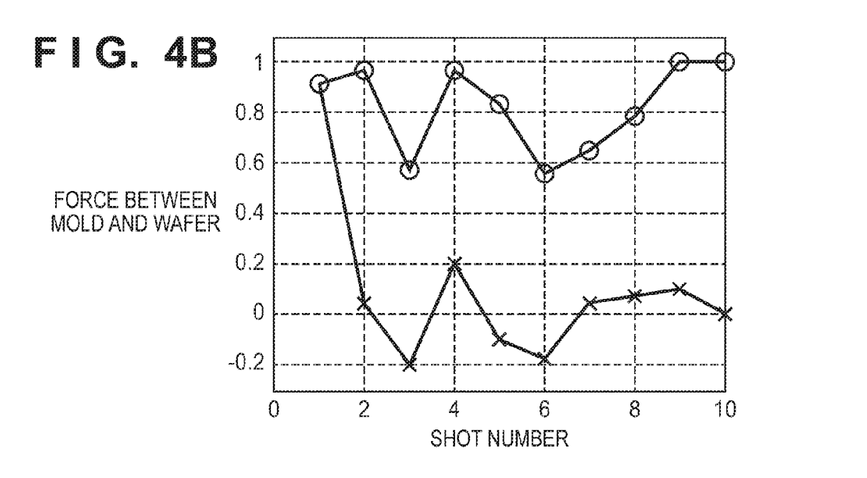
FIG. 4B is a graph of the force acting on the mold and the wafer.

A force between the mold 8 and the wafer 3 which acts when alignment of the relative position between the mold 8 and the wafer 3 is completed after the completion of the filling of the gap between the mold 8 and the wafer 3 with the resin is the product of the spring property of the resin and a relative movement. A force for each shot region is indicated by a ◯ mark plot in FIG. 4B. Again, the force between the mold 8 and the wafer 3 is normalized and shown, assuming that the maximum value is 1. In this embodiment, the correction instruction is generated before the completion of the resin filling in the second or subsequent shot region. The next example is a method of obtaining, as an offset, the average value of the estimated values of the initial displacements up to a previous shot region.

(correction instruction to Nth shot region)=(average value of estimated values of displacements in first to (N−1)th shot regions)     (1)

The Nth shot region is a shot region targeted for an imprint process. The first to (N−1)th shot regions are a plurality of other shot regions which are used to obtain an offset of the target shot region and in which the imprint process has been performed previously.

If the movement of the wafer stage 4 is completed according to this correction instruction before the completion of the resin filling, the shift component of the estimated value of the initial displacement in FIG. 4A need not be moved after the resin filling. As a result, correction can only be performed on the variation component after the resin filling. In this embodiment, the force between the mold 8 and the wafer 3 at the completion of alignment is indicated by a x mark plot in FIG. 4B. Since the x mark plot is shown at the same ratio as the ○ mark plot, it is the same value in the first shot region. In this example, the force between the mold 8 and the wafer 3 can be reduced by about 20% in the second or subsequent shot region. This correction instruction is similarly performed on a Y-axis and a θz-axis.

A calculation method of equation (1) can be changed as needed. For example, the estimated value of the initial displacement may drift in a given direction. This is caused by a change in heat, atmospheric pressure, or the like. In this case, the correction instruction is calculated by performing functional approximation, a statistical process, or the like on each estimated value of the initial displacement from the first to the (N−1)th shot regions, and predicting a displacement amount in the Nth region.

Figure 5:
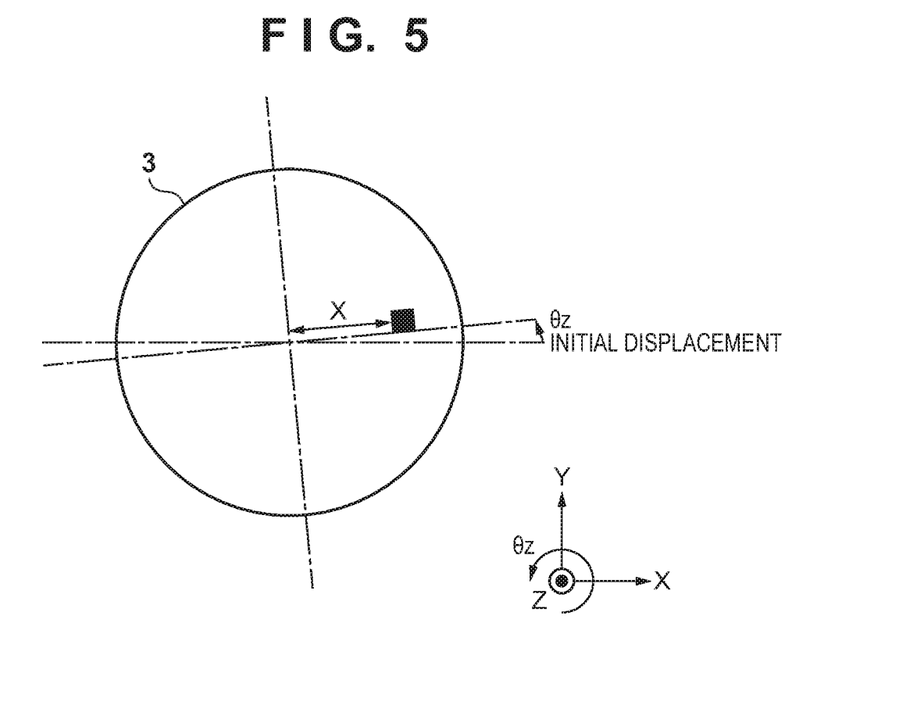
FIG. 5 is a view showing an influence by a displacement in a θz-axis direction.
Figure 6:
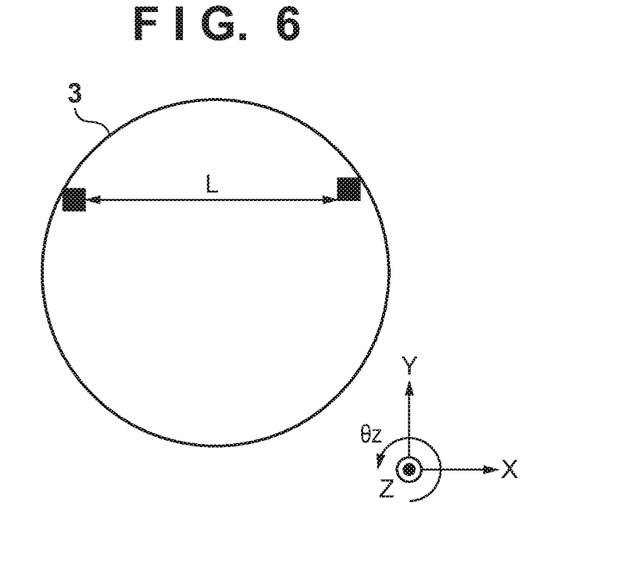
FIG. 6 is a view showing an example of a shot region in a peripheral portion.

If a large displacement of the initial position of the wafer 3 occurs on the θz-axis, as shown in FIG. 5, a position in the Y direction is displaced in accordance with, for example, the X-coordinate of the shot region. The influence of the θz-axis displacement can be reduced by obtaining the θz-axis displacement of the wafer 3 from the estimated value of the initial displacement on the θz-axis, and calculating the correction instruction from a positional relationship between the X- and Y-coordinates in each shot region. In order to efficiently obtain the displacement of the wafer 3 in the θz-axis direction, an imprint process can be performed in advance on a shot region close to the outer periphery of the wafer 3. FIG. 6 is an example of two shot regions close to the outer periphery of the wafer 3. The reason why the outer peripheral shot regions are advantageous is that when a displacement amount in a θz direction is calculated and obtained from a displacement amount in the X or Y direction, higher accuracy can be achieved as a span L between the shot regions increases. First several shot regions are likely to be defective devices because their initial displacements are large. Hence, it is possible to reduce the defective device by using a missing shot which is on the periphery of the wafer 3 and whose outer shape of the shot region falls outside the edge of the wafer 3.

In FIG. 6, the displacement in the θz direction can be obtained by dividing a difference in the displacement amounts in the Y direction between two shot regions by the span L. In order to have the large span L, an imprint process on a shot region which exists in a peripheral region outside the range of at least 0.5 times as large as the radius of the wafer 3 can be performed prior to that on a shot region in a central region. A method of obtaining the displacement amounts of the wafer 3 in the X, Y, and θz directions is not limited to the above-described method. A method of obtaining the displacement amounts by performing a statistical process based on the displacement amounts in the plurality of shot regions can be used. According to this method, it is possible to obtain not only mere displacements but also deformation components of expansion and contraction in a wafer plane.

[Article Manufacturing Method]

A manufacturing method of a device (a semiconductor integrated circuit device, a liquid crystal display device, an MEMS, or the like) as an article includes a step of transferring (forming) a pattern onto a substrate (a wafer, a glass plate, a film-like substrate, or the like) using the above-described imprint apparatus. The manufacturing method can also include a step of etching the substrate onto which the pattern is transferred. Note that when manufacturing another article such as a patterned media (storage medium) or an optical element, the manufacturing method can include, instead of the etching step, another processing step of processing the substrate onto which the pattern is transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-229781, filed Nov. 5, 2013, and 2014-194299, filed Sep. 24, 2014, which are hereby incorporated by reference herein in their entirety.

The invention claimed is:

1. An imprint apparatus for performing an imprint process of forming a pattern on an imprint material for a shot region of a plurality of shot regions on a substrate by bringing the imprint material on the substrate and a mold into contact with each other, the apparatus comprising:

a stage configured to hold the substrate;

a detector configured to detect a displacement in a relative position between the shot region and the mold in a direction parallel to a surface of the substrate when performing the imprint process for the shot region; and a controller configured to control the imprint process, wherein the controller is configured to:

obtain, when performing the imprint process for a first shot region of the plurality of shot regions, information relating to the displacement in the relative position between the first shot region on the substrate and the mold detected by the detector or a relative moving amount of the first shot region relative to the mold, which was used for aligning the first shot region and the mold with each other in the direction parallel to the surface of the substrate, after bringing the mold and the imprint material on the substrate into contact with each other;

adjust, when performing the imprint process for a second shot region of the plurality of shot regions, the relative position between the second shot region and the mold in the direction parallel to the surface of the substrate based on the obtained information relating to the displacement in the relative position between the first shot region on the substrate and the mold detected by the detector or the relative moving amount of the first shot region relative to the mold; and bring the mold and the imprint material on the substrate into contact with each other to perform the imprint process for the second shot region.

2. The apparatus according to claim 1, wherein the information includes information based on a driving amount of the stage to the mold taken to align the first shot region and the mold with each other in the direction parallel to the surface of the substrate after bringing the mold and the imprint material on the first shot region into contact with each other.

3. The apparatus according to claim 1, wherein after bringing the mold and the imprint material into contact with each other, the controller is configured to control the detector to detect the displacement in the relative position in the direction parallel to the surface of the substrate between the mold and the first shot region where the pattern is not formed, and further move the stage in the direction parallel to the surface of the substrate based on the detection result by the detector.

4. The apparatus according to claim 1, wherein the first shot region is a shot region where the pattern is first formed.

5. The apparatus according to claim 1, wherein the first shot region includes a plurality of shot regions where the patterns are formed.

6. The apparatus according to claim 2, wherein the first shot region includes a plurality of shot regions where the patterns are formed, and the controller is configured to obtain the information based on an average value of a plurality of driving amounts of the stage to the mold taken to align each of the plurality of shot regions relative to the mold in the direction parallel to the surface of the substrate after bringing the mold and the imprint material into contact with each other.

7. The apparatus according to claim 2, wherein the controller is configured to obtain the driving amount of the stage to the mold taken to align the first shot region relative to the mold in the direction parallel to the surface of the substrate based on a detection result of a displacement of the stage in the direction and a displacement of the mold in the direction after bringing the mold and the imprint material into contact with each other.

8. The apparatus according to claim 7, further comprising a second detector configured to detect the displacement of the mold in the direction.

9. The apparatus according to claim 8, wherein the second detector includes a displacement sensor.

10. The apparatus according to claim 8, wherein the second detector includes a strain gauge.

11. The apparatus according to claim 7, wherein the controller is configured to obtain a displacement amount of the mold in the direction based on a coefficient which defines a relationship between a driving force when the stage is moved in the direction and the displacement amount of the mold in the direction, and a driving force for moving the stage in the direction in a state in which the mold is brought into contact with the imprint material in the imprint process on the first shot region.

12. The apparatus according to claim 1, wherein the controller is configured to perform an imprint process on a shot region which exists in a peripheral region of the substrate prior to that on a shot region which exists in a central region of the substrate.

13. An imprint method of performing an imprint process of forming a pattern for a shot region on a substrate by bringing an imprint material on the substrate and a mold into contact with each other using an imprint apparatus which includes a stage configured to hold the substrate, and a detector configured to detect a displacement in a relative position between the shot region on the substrate and the mold in a direction parallel to a surface of the substrate when performing the imprint process for the shot region, the method comprising steps of:

obtaining, when performing the imprint process for a first shot region of the plurality of shot regions, information relating to the displacement in the relative position between the first shot region on the substrate and the mold detected by the detector or a relative moving amount of the first shot region relative to the mold, which was used for aligning the first shot region and the mold with each other in the direction parallel to the surface of the substrate, after bringing the mold and the imprint material on the substrate into contact with each other;

adjusting, when performing the imprint process for a second shot region of the plurality of shot regions, the relative position between the second shot region and the mold in the direction parallel to the surface of the substrate based on the obtained information relating to the displacement in the relative position between the first shot region on the substrate and the mold detected by the detector or the relative moving amount of the first shot region relative to the mold; and bringing the mold and the imprint material on the second shot region into contact with each other to perform the imprint process for the second shot region.

14. The imprint method according to claim 13, further comprising, after bringing the mold and the imprint material on the second shot region into contact with each other:

detecting a displacement in the relative position between the second shot region and the mold in the direction parallel to the surface of the substrate by the detector in a state in which the mold and the imprint material are in contact with each other;

moving the stage in the direction parallel to the surface of the substrate based on a detection result by the detector in the state in which the mold and the imprint material are in contact with each other; and curing the imprint material.

15. An article manufacturing method, the method comprising:

forming a pattern on a substrate using an imprint apparatus; and processing the substrate on which the pattern has been formed to manufacture the article, wherein the imprint apparatus performs an imprint process of forming a pattern on an imprint material for a shot region of a plurality of shot regions on a substrate by bringing the imprint material on the substrate and a mold into contact with each other, the apparatus including:

a stage configured to hold the substrate;

a detector configured to detect a displacement in a relative position between the shot region and the mold in a direction parallel to a surface of the substrate when performing the imprint process for the shot region; and a controller configured to control the imprint process, wherein the controller is configured to:

obtain, when performing the imprint process for a first shot region of the plurality of shot regions, information relating to the displacement in the relative position between the first shot region on the substrate and the mold detected by the detector or a relative moving amount of the first shot region relative to the mold, which was used for aligning the first shot region and the mold with each other in the direction parallel to the surface of the substrate, after bringing the mold and the imprint material on the substrate into contact with each other;

adjust, when performing the imprint process for a second shot region of the plurality of shot regions, the relative position between the second shot region and the mold in the direction parallel to the surface of the substrate based on the obtained information relating to the displacement in the relative position between the first shot region on the substrate and the mold detected by the detector or the relative moving amount of the first shot region relative to the mold; and bring the mold and the imprint material on the substrate into contact with each other to perform the imprint process for the second shot region.

* * * * *